(12) United States Patent
Chang et al.

(10) Patent No.: US 11,124,662 B2
(45) Date of Patent: Sep. 21, 2021

(54) POLYMER-POLYOXOMETALATE COMPOSITE INK AND APPLICATION THEREOF

(71) Applicant: Raynergy Tek Incorporation, Hsinchu (TW)

(72) Inventors: Yi-Ming Chang, Hsinchu (TW); Nai-Wei Teng, Hsinchu (TW)

(73) Assignee: RAYNERGY TEK INCORPORATION, Hsinchu (TW)

( * ) Notice: Subject to any disclaimer, the term of this patent is extended or adjusted under 35 U.S.C. 154(b) by 191 days.

(21) Appl. No.: 16/565,713

(22) Filed: Sep. 10, 2019

(65) Prior Publication Data

US 2020/0087524 A1 Mar. 19, 2020

Related U.S. Application Data

(60) Provisional application No. 62/732,165, filed on Sep. 17, 2018.

(51) Int. Cl.
| | |
|---|---|
| *C09D 11/03* | (2014.01) |
| *C09D 11/52* | (2014.01) |
| *C09D 11/102* | (2014.01) |
| *H01L 51/00* | (2006.01) |
| *H01L 51/42* | (2006.01) |
| *H01L 51/05* | (2006.01) |

(Continued)

(52) U.S. Cl.
CPC ............ *C09D 11/03* (2013.01); *C09D 11/102* (2013.01); *C09D 11/52* (2013.01); *H01L 51/0035* (2013.01); *H01L 51/0037* (2013.01); *C08K 3/24* (2013.01); *C08K 2003/329* (2013.01); *C08K 2201/001* (2013.01); *H01L 51/0003* (2013.01); *H01L 51/0508* (2013.01); *H01L 51/42* (2013.01); *H01L 51/50* (2013.01); *H01L 2251/303* (2013.01)

(58) Field of Classification Search
CPC ....... C09D 11/106; C09D 11/03; C09D 11/52; H01L 51/0037
See application file for complete search history.

(56) References Cited

U.S. PATENT DOCUMENTS

2018/0016456 A1* 1/2018 Wang .................. C09D 11/106

FOREIGN PATENT DOCUMENTS

| CN | 105793363 A | 7/2016 |
|---|---|---|
| CN | 106611818 A | 5/2017 |

(Continued)

OTHER PUBLICATIONS

Taiwan Patent Office "Office Action" dated Jul. 7, 2020, Taiwan.
Taiwan Patent Office "Office Action" dated Nov. 30, 2020, Taiwan.

*Primary Examiner* — Khanh T Nguyen
(74) *Attorney, Agent, or Firm* — WPAT, PC

(57) ABSTRACT

The present invention provides a polymer-polyoxometalate composite ink, which comprises a solvent, a polymer or an intertwined structure with more than one polymer and a polyoxometalate, wherein a weight ratio of the polymer or the intertwined structure with more than one polymer to the polyoxometalate is in the range from 1:0.001 to 1:0.09. The said polymer-polyoxometalate composite ink could be configured to produce a carrier transport film and an organic electronic device comprising the carrier transport film.

10 Claims, 3 Drawing Sheets

(51) Int. Cl.
 *C08K 3/32* (2006.01)
 *C08K 3/24* (2006.01)
 *H01L 51/50* (2006.01)

(56) References Cited

FOREIGN PATENT DOCUMENTS

| | | | | |
|---|---|---|---|---|
| CN | 107256947 A | * | 10/2017 | ........ H01M 10/0525 |
| TW | 201730257 A | | 9/2017 | |
| WO | WO2016095828 A1 | * | 6/2016 | .............. C08L 65/00 |

* cited by examiner

POLYMER-POLYOXOMETALATE COMPOSITE INK AND APPLICATION THEREOF

The present application is based on, and claims priority from, America provisional patent application number U.S. 62/732,165, filed on 2018 Sep. 17, the disclosure of which is hereby incorporated by reference herein in its entirety.

BACKGROUND OF THE INVENTION

Field of the Invention

The present invention provides a composite ink, more particularly, a polymer-polyoxometalate composite ink and the application thereof.

Description of the Prior Art

Organic electronic devices include organic photovoltaic devices, organic light sensing devices, organic light-emitting diodes, and organic thin film transistors (OTFT). In recent years, organic electronic devices have prospered under the development of new processes. In particular, the solution processing method has the advantages of not requiring a vacuum environment, operating at a low temperature, low cost, roll-to-roll production with large area, etc.

Taking the structure of organic photovoltaic device as an example, it generally comprises a transparent substrate, a transparent electrode (such as ITO), a first carrier transport layer, an active layer, a second carrier transport layer and a metal electrode (such as aluminum or silver), wherein a carrier transport material used for hole transporting mainly includes two types such as polymers and metal oxides. The metal oxides, such as molybdenum oxide, vanadium oxide, nickel oxide, tungsten oxide, etc., have advantages such as energy level matching and high material stability. However, the conventional metal oxide film is mostly deposited by vacuum evaporation, which is incompatible with the printing coating method based on the solution state, and is also disadvantageous for the large-area roll-to-roll production.

Another type of material commonly used for hole transporting is a polymer mainly comprising poly(3,4-ethylenedioxythiophene): poly(styrenesulfonate), i.e., PEDOT:PSS conductive polymer. The PEDOT:PSS conductive polymer is a material that has been widely used commercially. The PEDOT:PSS conductive polymer can be well dispersed in the aqueous solvent, can be applied in large area coating, is easy to use with various coating or printing techniques, and has high film forming quality. However, compared with the hole transport layer with metal oxide of the organic photovoltaic device, the hole transport layer with PEDOT:PSS significantly reduces the photoelectric efficacy of terminal product because the characteristics of carrier transporting and energy level matching of PEDOT:PSS are not as good as those of the vapor deposition type metal oxide.

In summary, it is necessary for the academic community and the industry to invest heavily in the development of a hole transport layer material suitable for large-area production and high photoelectric efficiency.

SUMMARY OF THE INVENTION

An object of the present invention is to provide a composite ink containing PMA:PEDOT:PSS.

Another object of the present invention is to provide a hole transport layer material suitable for large-area production and having high photoelectric efficiency.

BRIEF DESCRIPTION OF THE APPENDED DRAWINGS

Some of the embodiments will be described in detail, with reference to the following figures, wherein like designations denote like members, wherein.

Figure 1A:
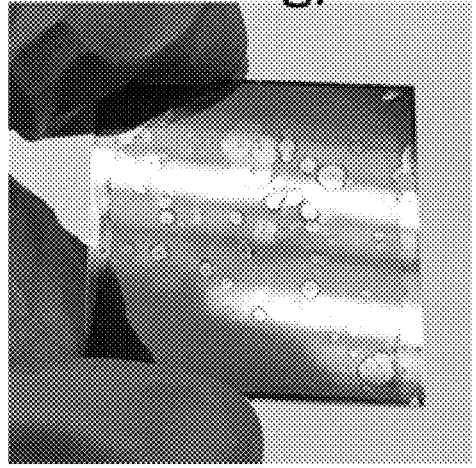
FIG. 1A to 1C show the film forming quality of the carrier transport film.

The advantages, spirits, and features of the present invention will be explained and discussed with embodiments and figures as follows.

DETAILED DESCRIPTION OF THE INVENTION

Definition

The fill factor (FF) used herein refers to the ratio of the actual maximum available power (Pm or $V_{mp}*J_{mp}$) to the theoretical (non-actually available) power ($J_{sc}*V_{oc}$). Therefore, the fill factor can be determined by the following formula:

$$FF=(V_{mp}*J_{mp})/(V_{oc}*J_{sc})$$

Wherein, the $J_{mp}$ and $V_{mp}$ respectively represent the current density and voltage at the maximum power point ($P_m$), which is obtained by varying the resistance in the circuit to the maximum value of J*V. $J_{sc}$ and $V_{oc}$ represent open circuit current and open circuit voltage, respectively. The fill factor is a key parameter for evaluating solar cells.

The open circuit voltage ($V_{oc}$) used herein is the potential difference between the anode and the cathode of the component without connecting the external load.

The power conversion efficiency (PCE) of solar cells used herein refers to the conversion percentage of power from the incident light to the electricity. The power conversion efficiency (PCE) of solar cells can be calculated by dividing the maximum power point ($P_m$) by the incident light irradiance (E; $W/m^2$) under the standard test conditions (STC) and the surface area (Ac; $m^2$) of the solar cells. STC generally refers to an air mass (AM) 1.5G spectrum at a temperature of 25° C. and an irradiance of 1000 $W/m^2$.

A member (e.g., a thin film layer) as used herein can be considered "photoactive" if it contains one or more excitons that absorb photons to produce photocurrents.

As used herein, "solution proceeding" refers to a process in which a compound (e.g., a polymer), material, or composition can be used in a solution state, such as spin coating, printing (e.g., inkjet printing, gravure printing, letterpress printing, etc.), spray coating, slit coating, drop casting, dip coating, and knife coating.

As used herein, "annealing" refers to a post-deposition heat treatment of a semi-crystalline polymer film in general environment or under decompressed or pressurized environment. "Annealing temperature" means the temperature at which the polymer film or the mixed film of the polymer and other molecules can undergo small-scale molecular motion and rearrangement during the annealing process. Without limitation by any particular theory, it is believed that annealing may result in increasing the crystallinity in the polymer film, increasing the material carrier mobility of the polymer film or the mixed film of the polymer and other molecules, and forming molecular interactions to achieve independent transmission paths of electrons and holes.

A first embodiment of the present invention discloses a polymer-polyoxometalate composite ink comprising a solvent, a polymer or an intertwined structure with more than one polymer, and a polyoxometalate. Wherein, a weight ratio of the polymer or the intertwined structure with more than one polymer to the polyoxometalate is in the range from 1:0.001 to 1:0.09. Preferably, the weight ratio of the polymer or the intertwined structure with more than one polymer to the polyoxometalate is in the range from 1:0.005 to 1:0.03.

In an embodiment, the intertwined structure is poly(3,4-ethylenedioxythiophene):poly(styrenesulfonate) (PEDOT:PSS).

In another embodiment, the polyoxometalate is one or a combination of more than one polyoxometalate selected from the group consisting of molybdenum, tungsten and vanadium. Preferably, the polyoxometalate is phosphomolybdic acid (PMA).

The agglomeration of the polyoxometalate can be reduced in the polymer-polyoxometalate composite ink of the present invention by uniformly mixing the polymer interlaced structure with the polyoxometalate, so as to improve the uniformity of film forming. At the same time, the polyoxometalate also has the function of adjusting the work function of the intertwined structure of the polymer, thereby changing the performance of the organic electronic device.

In another embodiment, the concentration of the polyoxometalate in the polymer-polyoxometalate composite ink is in the range from 0.01 to 0.8 mg/mL. Preferably, the concentration of the polyoxometalate in the polymer-polyoxometalate composite ink is in the range from 0.05 to 0.2 mg/mL.

In the present embodiment, the solvent is one or a combination selected from the group consisting of methanol, ethanol, n-propanol, isopropanol, n-butanol, tert-butanol, ethylene glycol, and ethylene glycol monomethyl ether.

A second embodiment of the present invention discloses a carrier transport film formed by the polymer-polyoxometalate composite ink described in the first embodiment.

A third embodiment of the present invention discloses an organic electronic device comprising a first electrode (transparent electrode), a first carrier transport layer, an active layer, a second carrier transport layer, and a second electrode. The first carrier transport layer is located between the first electrode and the active layer. The second carrier transport layer is located between the active layer and the second electrode, and the second carrier transport layer is the carrier transport film described in the second embodiment. In addition, the organic electronic device includes an organic photovoltaic device, an organic light sensing device, an organic light-emitting diode, and an organic thin film transistor (OTFT).

EXAMPLE

Example 1: Preparation of the Polymer-Polyoxometalate Composite Ink a. Reagent A: 2 mg of polyoxometalate series compounds (e.g., phosphomolybdic acid, PMA) is dissolved in 1 mL of polar solvent (e.g., 2-propanol).

b. Reagent A and reagent B: poly(3,4-ethylenedioxythiophene): poly(styrenesulfonate) (PEDOT:PSS) solution are mixed at a volume ratio of 1:9 (Example: 1 mL of reagent A is added to 9 mL of reagent B, wherein the PEDOT:PSS solid content of reagent B is about 1% in $H_2O$, so 9 mL (9 g) of PEDOT:PSS solution contains about 90 mg of PEDOT:PSS solid).

c. For each 10 mL of the mixture of reagent A and reagent B, the weight ratio of PEDOT:PSS (solid) to polyoxometalate (solid) is 90 mg: 2 mg=1:0.022.

d. Each 10 mL of the mixture of reagent A and reagent B contains 2 mg of PMA. The concentration of PMA in the solution was 2 mg/10 mL=0.20 mg/mL.

Example 2: Manufacturing and Testing of the Organic Photovoltaic Devices

A glass coated by a pre-patterned ITO with a sheet resistance of ~15 Ω/sq is used as a substrate. The substrate is ultrasonically oscillated in soap deionized water, deionized water, acetone, and isopropanol in sequence, and washed in each step for 15 minutes. The washed substrate is further treated with a UV-ozone cleaner for 30 minutes. A top coating layer of ZnO (diethylzinc solution, 15 wt % in toluene, diluted with tetrahydrofuran) is spin coated on the ITO substrate with a rotation rate of 5000 rpm for 30 seconds, and then baked at 150° C. in air for 20 minutes. The active layer solution was prepared in o-xylene. The active layer material is a mixture of a conjugated polymer and a fullerene derivative, and the concentration of the active layer material is 35 mg/mL. To completely dissolve the active layer material, the active layer solution is stirred on a hot plate at 120° C. for at least 1 hour. Then, the active layer material is returned to the room temperature for spin coating. Finally, the coated active layer film is annealed at 120° C. for 5 minutes. The mixed solution of reagent A and reagent B provided in Example 1 is then coated or printed on the active layer and dried to form a carrier transport film.

Figure 1B:
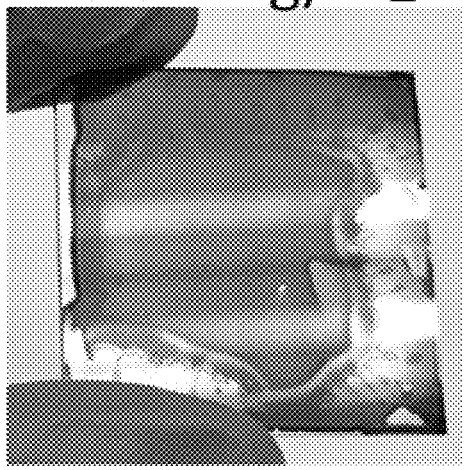
Figure 1C:
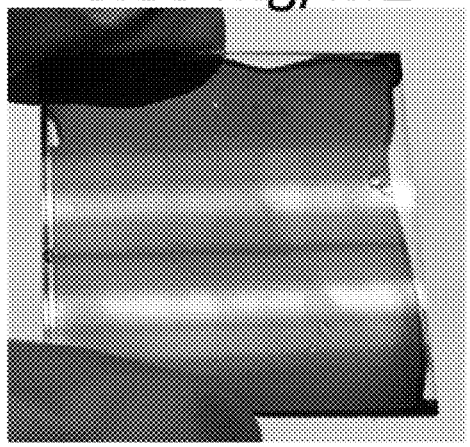

Regarding the film forming quality of the carrier transfer film, please refer to the different recipes listed in Table 1, FIG. 1A, FIG. 1B and FIG. 1C. FIG. 1A shows a film made by recipe A on the active layer of the photovoltaic component, FIG. 1B shows a film made by recipe B on the active layer of the photovoltaic component, and FIG. 1C shows a film made by recipe D on the active layer of the photovoltaic component. The most important factor affecting the quality of film formation is the concentration of PMA in PEDOT:PSS solution. The control group in Table 1 is PEDOT:PSS solution without PMA at all, where the solution is not gelled and the film is a complete film. The concentrations of PMA in recipe A and recipe B are higher (0.83 and 0.67 mg/mL) and the mixing ratios of reagent A (solvent is alcohol) and reagent B (solvent is water) are also similar (1:5 and 1:2). Therefore, it can be found that under the alternate interaction of the alcohol solvent and water and PMA and PEDOT:PSS, the mixed solution gelatinizes and cannot form a complete film (Please refer to FIG. 1A and FIG. 1B). In recipe C, although the mixing ratio of reagent A and reagent B has been increased to 1:10, it cannot form the ideal film surface because the PMA content in reagent A is relatively high (10 mg/mL) and the content of the whole PMA in reagent B is 0.91 mg/mL. This shows the content of PMA is important for film formation. The mixing ratio of reagent A to reagent B in recipe D is adjusted to 1:9, and the concentration of PMA in reagent B is lowered to 0.80 mg/mL. It is found that the mixed solution is gelled, but the gelation rate is slow so that a complete film could be formed.

TABLE 1

| Recipe | PMA in alcohol (mg/mL) | (PMA:alcohol): PEDOT:PSS solution | PEDOT:PSS to PMA ratio in weight | Conc. of PMA in PEDOT:PSS solution | Ink appearance | Film appearance |
|---|---|---|---|---|---|---|
| Control | 0 mg/mL | — | 1:0 | 0 mg/mL | Fluid | Good |
| A | 1 mg/mL | 1:5 | 1:0.5 | 0.83 mg/mL | Gelled | Poor |
| B | 1 mg/mL | 1:2 | 1:0.2 | 0.67 mg/mL | Gelled quickly | Poor |
| C | 10 mg/mL | 1:10 | 1:0.1 | 0.91 mg/mL | Gelled quickly | Poor |
| D | 8 mg/mL | 1:9 | 1:0.88 | 0.80 mg/mL | Gelled slowly | Acceptable |

Subsequently, silver is deposited with a thickness of 100 nm as an upper electrode. All components are packaged with epoxy in a glove box. The J-V characteristics of the components are measured by a class AAA solar simulator at an air mass (AM) of 1.5G. and under a light having a light intensity with 1000 W/m$^2$. Herein, the calibration battery used to correct the light intensity is a standard silicon diode with a KG5 filter and is calibrated by a third party before use. This test uses a Keithley 2400 source meter instrument to record the J-V characteristics. The battery area is 4 mm$^2$ which is defined by aligning a metal mask to the component.

Example 3: Performance Analysis of the Organic Photovoltaic Devices

Figure 2A:
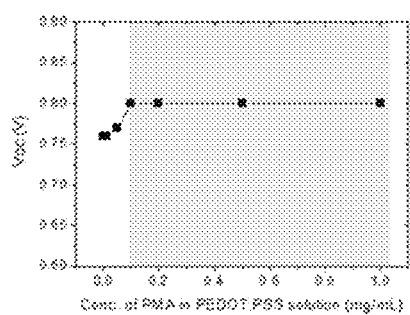
FIG. 2A to 2D show the effect of PMA concentration on the optoelectronic performance of an organic photovoltaic device.
Figure 2B:
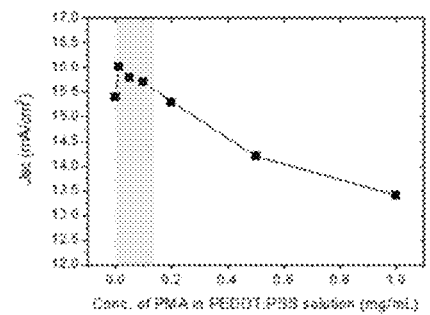
Figure 2C:
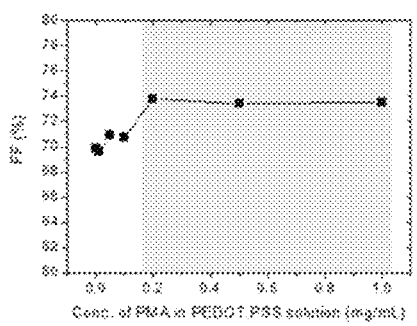
Figure 2D:
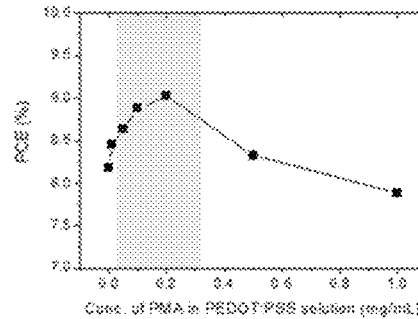

Regarding the influence of the concentration of PMA on photoelectric performance, please refer to Table 2, FIG. 2A, FIG. 2B, FIG. 2C and FIG. 2D. FIG. 2A shows that when the concentration of PMA is maintained above 0.1 mg/mL, the open circuit voltage ($V_{oc}$) of the device is maintained at around 0.8V. FIG. 2B shows that when the concentration of PMA is between 0.01 mg/mL and 0.2 mg/mL, the open circuit current ($J_{sc}$) of the device can be maintained above 15 mA/cm$^2$. FIG. 2C shows that when the concentration of PMA is above 0.2 mg/ml, the fill factor (FF) of the device can be maintained above 72%. FIG. 2D shows that when the concentration of PMA is between 0.01 mg/mL and 0.3 mg/mL, the power conversion efficiency (PCE) of the device can be maintained above 8.4%.

Figure 3A:
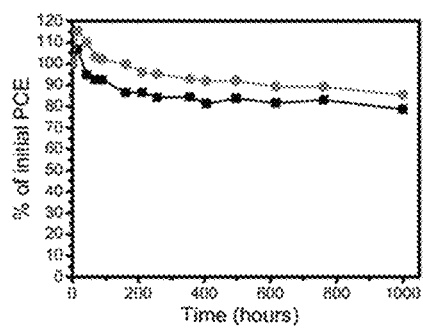
FIG. 3A to 3D show the comparison of the photoelectric performance of the components with the PMA:PEDOT:PSS carrier transport film and the photoelectric performance of the components with the PEDOT:PSS carrier transport film alone.
Figure 3B:
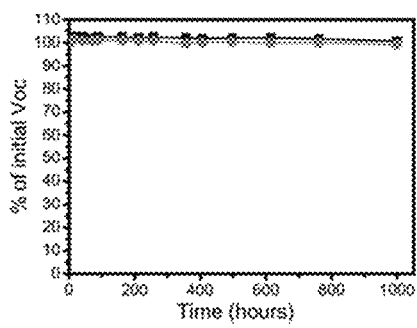
Figure 3C:
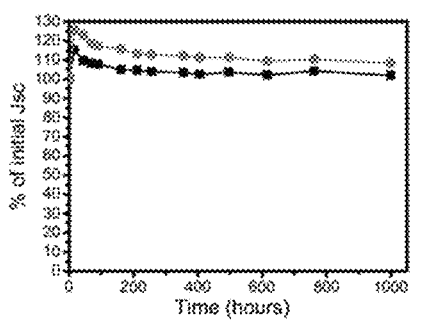
Figure 3D:
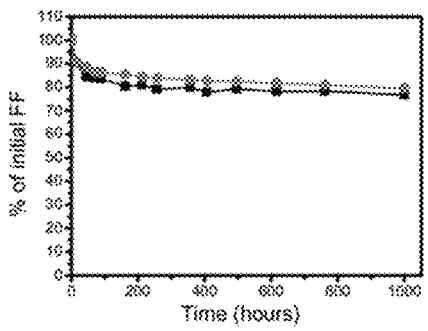

Referring to FIG. 3A to FIG. 3D again. The data presented by blocks show the performances of an organic photovoltaic device made by the control group recipe, and the data presented by circles are the performances of an organic photovoltaic device made by recipe E. It can be found that the photoelectric performance of the device of the carrier transfer film with PMA:PEDOT:PSS is superior to that of the carrier transfer film with the PEDOT:PSS alone. In addition, the device of the carrier transfer film with PMA:PEDOT:PSS can maintain good stability over a long period of time.

TABLE 2

| Recipe | PMA in alcohol (mg/mL) | (PMA:alcohol): PEDOT:PSS solution | PEDOT:PSS to PMA ratio in weight | Conc. of PMA in EDOT:PSS solution | Ink appearance | Film appearance | $V_{oc}$ (V) | $J_{sc}$ (mA/cm$^2$) | FF (%) | PCE (%) |
|---|---|---|---|---|---|---|---|---|---|---|
| Control | 0 mg/mL | — | 1:0 | 0 mg/mL | Fluid | Good | 0.76 | 15.4 | 69.9 | 8.18 |
| A | 1 mg/mL | 1:5 | 1:0.5 | 0.83 mg/mL | Gelled | Poor | — | — | — | — |
| B | 1 mg/mL | 1:2 | 1:0.2 | 0.67 mg/mL | Gelled quickly | Poor | — | — | — | — |
| C | 10 mg/mL | 1:10 | 1:0.1 | 0.91 mg/mL | Gelled quickly | Poor | — | — | — | — |
| D | 8 mg/mL | 1:9 | 1:0.88 | 0.80 mg/mL | Gelled slowly | Acceptable | 0.80 | 13.4 | 73.5 | 7.88 |
| E | 5 mg/mL | 1:9 | 1:0.055 | 0.50 mg/mL | Fluid | Good | 0.80 | 14.2 | 73.4 | 8.33 |
| F | 2 mg/mL | 1:9 | 1:0.022 | 0.20 mg/mL | Fluid | Good | 0.80 | 15.3 | 73.8 | 9.03 |
| G | 1 mg/mL | 1:9 | 1:0.011 | 0.10 mg/mL | Fluid | Good | 0.80 | 15.7 | 70.7 | 8.88 |
| H | 0.5 mg/mL | 1:9 | 1:0.0055 | 0.05 mg/mL | Fluid | Good | 0.77 | 15.8 | 70.9 | 8.63 |
| I | 0.1 mg/mL | 1:9 | 1:0.0011 | 0.01 mg/mL | Fluid | Good | 0.76 | 16.0 | 69.6 | 8.46 |

With the examples and explanations mentioned above, the features and spirits of the invention are hopefully well described. More importantly, the present invention is not limited to the embodiment described herein. Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A polymer-polyoxometalate composite ink, comprising:
   a solvent;
   a polymer or an intertwined structure with more than one polymer; and
   a polyoxometalate, wherein a weight ratio of the polymer or the intertwined structure with more than one polymer to the polyoxometalate is in the range from 1:0.001 to 1:0.055.

2. The polymer-polyoxometalate composite ink of the claim 1, wherein the weight ratio of the polymer or the intertwined structure with more than one polymer to the polyoxometalate is in the range from 1:0.005 to 1:0.03.

3. The polymer-polyoxometalate composite ink of the claim 1, wherein the concentration of the polyoxometalate in the polymer-polyoxometalate composite ink is in the range from 0.01 to 0.8 mg/mL.

4. The polymer-polyoxometalate composite ink of the claim 1, wherein the concentration of the polyoxometalate in the polymer-polyoxometalate composite ink is in the range from 0.05 to 0.2 mg/mL.

5. The polymer-polyoxometalate composite ink of the claim 1, wherein the intertwined structure with more than one polymer is poly(3,4-ethylenedioxythiophene):poly(styrenesulfonate) (PEDOT:PSS).

6. The polymer-polyoxometalate composite ink of the claim 1, wherein the polyoxometalate is one or a combination of more than one polyoxometalate selected from the group consisting of molybdenum, tungsten and vanadium.

7. The polymer-polyoxometalate composite ink of the claim 1, wherein the polyoxometalate is phosphomolybdic acid (PMA).

8. The polymer-polyoxometalate composite ink of the claim 1, wherein the solvent is one or a combination selected from the group consisting of methanol, ethanol, n-propanol, isopropanol, n-butanol, tert-butanol, ethylene glycol, and ethylene glycol monomethyl ether.

9. A carrier transport film formed by the polymer-polyoxometalate composite ink of the claim 1.

10. An organic electronic device, comprising:
a first electrode being a transparent electrode;
a first carrier transport layer;
an active layer, wherein the first carrier transport layer is located between the first electrode and the active layer;
a second carrier transport layer; and
a second electrode, wherein the second carrier transport layer is located between the active layer and the second electrode, and the second carrier transport layer is the second carrier transport film of the claim 9.

* * * * *